United States Patent [19]

White et al.

[11] 4,417,317
[45] Nov. 22, 1983

[54] ADAPTIVE ANALOG PROCESSOR

[75] Inventors: Marvin H. White, Columbia; Ingham A. G. Mack, Laurel, both of Md.

[73] Assignee: Westinghouse Electric Corp., Pittsburgh, Pa.

[21] Appl. No.: 355,075

[22] Filed: Mar. 5, 1982

Related U.S. Application Data

[63] Continuation of Ser. No. 118,052, Feb. 4, 1980, abandoned.

[51] Int. Cl.³ .................. H04B 3/04; H03H 21/00; G11C 11/40
[52] U.S. Cl. ................................. 364/825; 333/165; 364/862; 375/14
[58] Field of Search ............... 364/604, 724, 728, 825; 333/18, 28, 165, 166; 375/12, 14

[56] References Cited

U.S. PATENT DOCUMENTS

| | | | |
|---|---|---|---|
| Re. 30,087 | 8/1978 | Lampe et al. | 357/24 |
| 3,781,720 | 12/1973 | Mueller | 375/14 X |
| 3,875,515 | 4/1975 | Stuart et al. | 375/14 |
| 3,987,292 | 10/1976 | Means | 364/604 X |
| 3,992,616 | 11/1976 | Acker | 375/14 X |
| 4,034,199 | 7/1977 | Lampe et al. | 364/825 |
| 4,041,298 | 8/1977 | Lampe et al. | 364/825 |
| 4,041,418 | 8/1977 | Koeth | 375/14 X |
| 4,097,807 | 6/1978 | Fujimura | 375/14 |
| 4,097,844 | 6/1978 | Moyer | 364/824 X |
| 4,112,456 | 9/1978 | Lampe et al. | 357/24 |
| 4,196,405 | 4/1980 | Le Dily et al. | 375/14 X |
| 4,233,683 | 11/1980 | McRae | 375/14 |

OTHER PUBLICATIONS

Widron et al: Adaptive Switching Circuits IRE Wescon Convention Record Part 4 vol. 4, 1960 pp. 96-104.
Moschner: Adaptive Fiber with Clipped Input Data Shamfered Electronics Lab. Technical Report #6796-1 Jun. 1970 Stanford University, Calif.

Primary Examiner—Felix D. Gruber
Attorney, Agent, or Firm—R. M. Trepp

[57] ABSTRACT

An adaptive analog processor incorporating a analog shift register having a plurality of taps, multipliers at each tap for multiplying the tap value times a weight value, a first adder for summing the output of the multipliers, a second adder for subtracting the output of the adder from a second analog signal, means for incrementing the weights in response to the magnitude and polarity of the error signal and the polarity of the data signal. The invention overcomes the problem of building monolithic multitap adaptive filters utilizing the clipped-data least mean square error algorithm.

7 Claims, 17 Drawing Figures

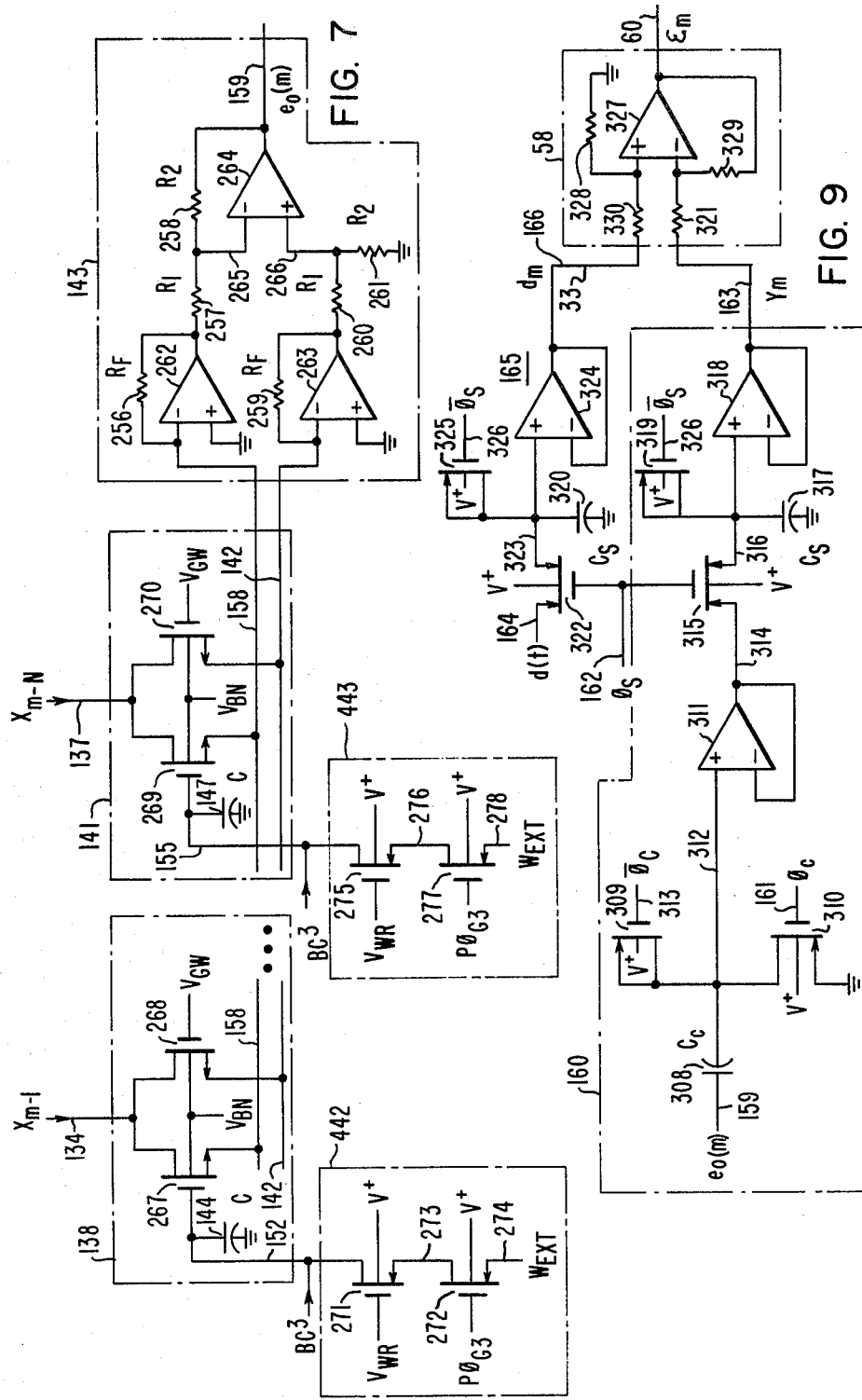

ADAPTIVE ANALOG PROCESSOR

GOVERNMENT CONTRACT

The Government has rights in this invention pursuant to Contract No. NOO173-76-C-0147 awarded by the Department of the Navy.

This is a continuation of application Ser. No. 118,052, filed Feb. 4, 1980 and now abandoned.

BACKGROUND OF THE INVENTION

1. Field of the Invention

This invention relates to adaptive analog filters, particularly to monolithic integrated circuit implementation of a filter using a least mean square error algorithm.

2. Description of the Prior Art

One example of an adaptive filter is one that implements the least mean square (LMS) algorithm developed by Widrow and Hoff and described in a publication entitled "Adaptive Switching Circuits," in IRE WESCON Conv. Rec., pt. 4, p. 96, 1960. A modification of the least mean square algorithm developed by Widrow and Hoff was made by Moschner and was described in a publication entitled "Adaptive Filter with Clipped Input Data," Stanford Lab Report 6796-1, June 1970. Both Widrow and Hoff and Moschner provided an algorithm which simplified the calculation of the least mean square algorithm by eliminating the need to average data over a large number of samples and by retaining the polarity of the delayed input reference data to determine the direction of weight adjustment.

The least mean square algorithm is more complex to implement than a programmable analog transversal filter in that an input signal is sampled to provide a sequence of discrete signals or samples, each of which are weighted and summed to provide an output signal, the output signal is then subtracted from a desired signal to provide an error signal $\epsilon_m$ which is used to modify the value of the weight at each tap of a tapped delay line.

One example of a programmable analog transversal filter is described in U.S. Pat. No. 4,034,199 which was issued on July 5, 1977 to D. R. Lampe, M. H. White, and J. H. Mims and assigned to the assignee herein. In U.S. Pat. No. 4,034,199 a transversal filter is described comprising a charge coupled device for receiving a series of discrete analog signals to be delayed by increasing periods of time and having outputs from each stage of the charge coupled device coupled to MNOS transistors having variable thresholds for weighting the data at each tap location. The weighted output of each tap was summed in an integrator to provide an output signal. Means were provided to program the weights at each tap according to predetermined control signals.

An adaptive analog processor is a step further in complexity in that the weights for each tap are adjusted automatically with the arrival of each new sample of data by means of a recursive algorithm.

It is therefore desirable to implement through various techniques an adaptive analog processor on an integrated circuit chip.

It is further desirable to implement an adaptive analog processor utilizing charge transfer devices.

It is further desirable to implement an adaptive analog processor including means for concomitant updating of the weights at each tap location.

It is further desirable to provide means for applying positive as well as negative weights to each tap of a tapped delay line.

It is further desirable to provide means to compensate for direct current offsets in the tap multiplier weights, temperature drift of chip components, and long term drift of input analog signals through the use of a direct current bias tap weight.

It is further desirable to utilize a low power, high-speed, minimum area, integrated circuit technology, for example CMOS, to implement analog (e.g. operational amplifiers) and digital (e.g. clocks, drivers, etc.) functions on the chip.

It is further desirable to utilize a comparator, an exclusive OR and a digital tapped delay line to facilitate updating the weights at each tap location, thereby avoiding the requirement of a four-quadrant analog multiplier at each tap location.

It is further desirable to implement an adaptive analog processor utilizing an absolute value amplifier which may amplify either positive or negative signal values.

It is further desirable to implement an adaptive analog processor utilizing a charge coupled device delay line which is clocked with a 2 phase clock to increase the time the data is valid at each tap location.

SUMMARY OF THE INVENTION

In accordance with the present invention, apparatus is provided for processing a first analog reference signal represented by a plurality of time spaced discrete analog data samples each having a single value, comprising means for storing a predetermined number of these successive discrete analog data samples, means for storing the polarity of these successive discrete analog data samples, means for storing a plurality of weights, means for multiplying a plurality of these successive discrete analog data samples by a plurality of the weights to form a plurality of products, means for summing the products together to provide a first output sample, means for processing a second analog desired signal represented by a plurality of time spaced discrete analog data samples each having a single value, means for subtracting the first output sample from the second analog input sample to form a second output sample indicative of an error signal, and means for incrementing the value of each stored weight as a function of the value of the second output sample and the polarity of the successive discrete first analog reference data samples.

BRIEF DESCRIPTION OF THE DRAWINGS

FIG. 7 is a schematic diagram of a number of multiplier circuits in a product summing circuit.

FIG. 9 is a schematic diagram of the correlated double sampling (CDS) circuit.

DESCRIPTION OF THE PREFERRED EMBODIMENT

Figure 1:
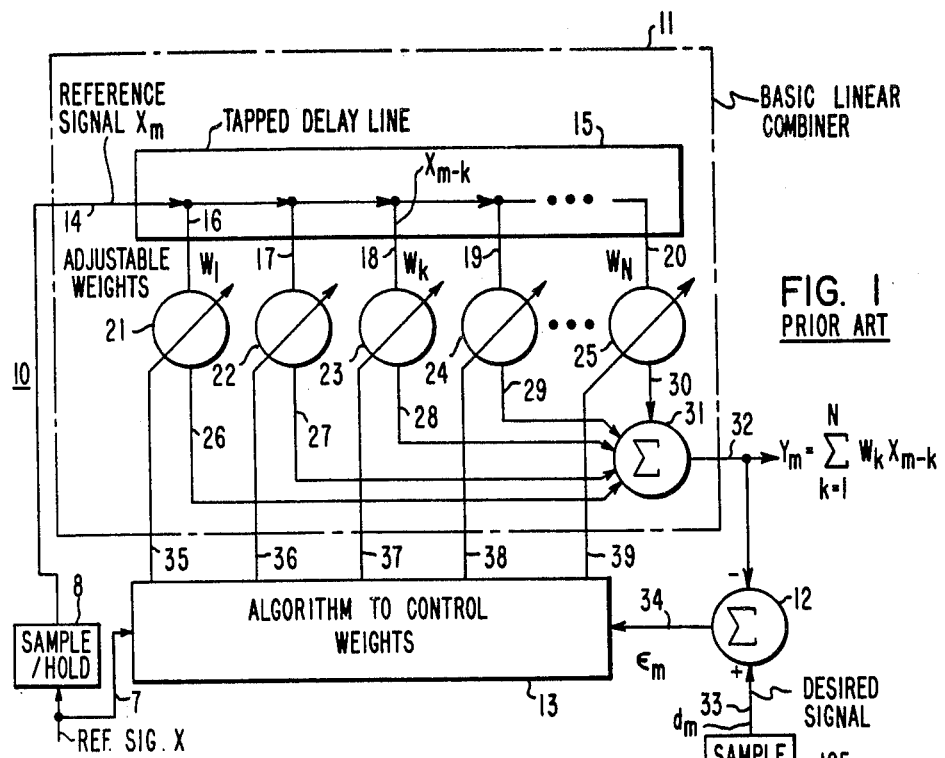
FIG. 1 is a general block diagram of an adaptive filter.

Referring now to the drawing and in particular to FIG. 1, an adaptive filter 10 is shown for processing a first analog reference signal $X_m$ comprising a basic linear combiner 11, an adder 12 and algorithm to control weights 13. An input analog reference signal represented by a plurality of timed spaced discrete analog data samples, $X_m$, is coupled over line 14 to an input of tapped delay line 15 having a plurality of taps 16-20. Tapped delay line 15 may, for example, be a charge transfer device shift register for storing successive discrete analog data samples, which may be non-destructively coupled to taps or lines 16-20. The first tap of delay line 15 provides data $X_{m-1}$. The $k^{th}$ tap of delay line 15 provides data $X_{m-k}$ and the $N^{th}$ tap provides N data signal $X_{m-N}$. Each tap of the tapped delay line 16-20 is coupled through multipliers 21-25, respectively, and coupled over lines 26-30, respectively, to a respective input on adder 31. Adder 31 functions to sum all the products from multipliers 21-25, to provide an output signal over line 32 to an input of adder 12. Line 32 is designated the first analog output signal $Y_m$. A second input analog desired signal represented by a plurality of time spaced discrete analog data samples $d_m$ is coupled over line 33 to a second input of adder 12. Adder 12 functions to subtract the discrete analog data samples on line 32 from line 33 to provide the difference signal on line 34, $\epsilon_m$. Line 34 is coupled into an input of an algorithm which functions to control weights 21-25 over lines 35-39. The weights may be stored at multipliers 21-25 and represent the second number or value which is used to multiply the data samples, $X_{m-k}$. The signal $X_m$ represents a discrete analog data sample at a particular time. A sequence of k time intervals will place signal $X_m$ at the $k^{th}$ tap of the $k^{th}$ delay line 15, the data being designated $X_{m-k}$. Subscript "m" with respect to signals Y, $\epsilon$ and d on lines 32, 34 and 33 represent the value of these signals during the present time interval m.

The "algorithm to control weights" 13 may, for example, minimize the mean square error (MSE) such that the 1st analog filter output $Y_m$ approximates in real time, $d_m$ in the least mean square sense. The nature of the 1st analog filter input $X_m$ and 2nd analog filter input $d_m$ determines the function of the filter, whether it be an estimator, predictor, correlator, etc. In general, the so-called algorithm approach permits real time filter operations without the need to measure explicitly correlation functions such as $\overline{d_m X_{m-K}}$ and $\overline{X_{m-k} X_{m-1}}$ and without the requirement of large memory storage, digital adders and multipliers, mathematical averaging, and matrix inversion.

A particular algorithm which is implemented to control the value of the weights in the "algorithm to control weights" 13 of FIG. 1 is the "clipped data" least mean square algorithm described by J. L. Moschner in a publication entitled "Adaptive Filter with Clipped Input Data," Stanford Lab Report 6796-1, June 1970. Utilizing the "clipped data" least mean square algorithm the weight to be applied at the $k^{th}$ tap of delay line 15 during the next time interval m+1 is determined by equation (1).

$$W_k(m+1) = W_k(m) + 2\mu |\epsilon_m| \mathrm{sgn}(\epsilon_m)\mathrm{sgn}(X_{m-k}) \qquad (1)$$

In equation (1), $\mu$ is a convergence constant which is responsible for the stability and rate of convergence of the filter. $W_k(m)$ is the value of the weight at the $k^{th}$ tap location during the $m^{th}$ time interval. $|\epsilon_m|$ is the absolute value of the error signal during the $m^{th}$ time interval. Sgn($\epsilon_m$) is the polarity of the error signal $\epsilon_m$ expressed as +1 or −1. Sgn($X_{m-k}$) is the polarity of the data signal $X_{m-k}$ and is expressed as +1 for $X_{m-k} \geq 0$ and −1 for $X_{m-k} < 0$.

Figure 2:
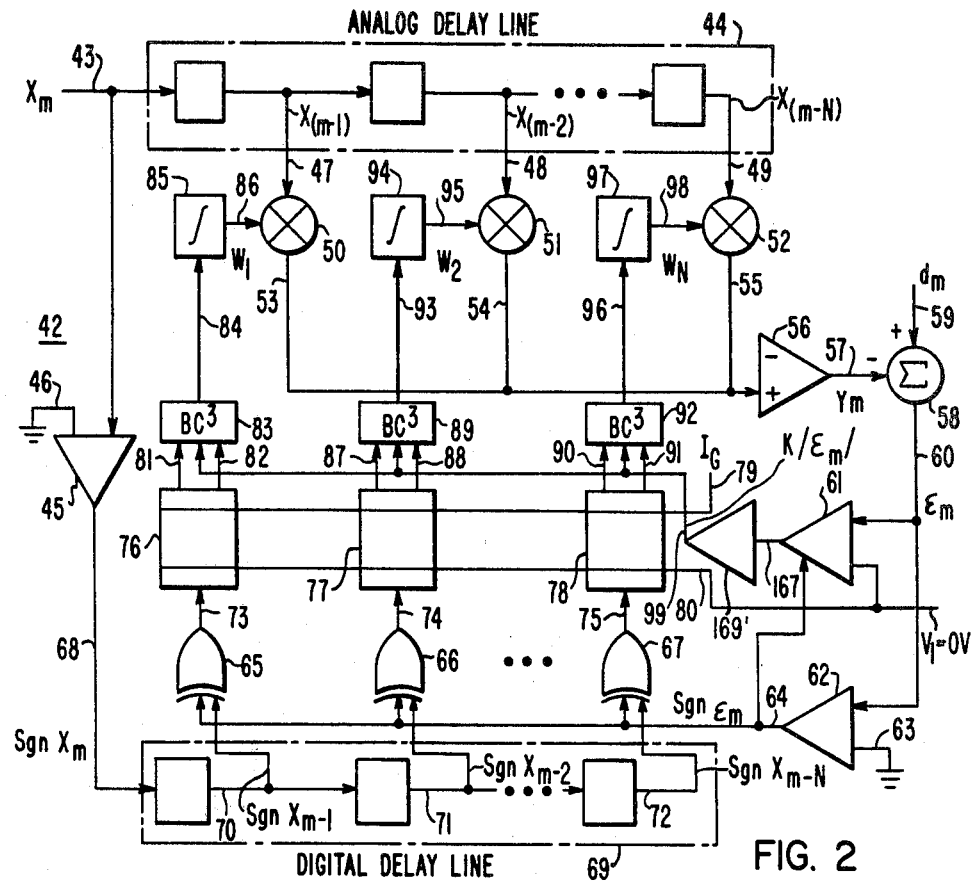
FIG. 2 is a block diagram of an adaptive filter utilizing the clipped-data least mean square algorithm.

FIG. 2 is one embodiment of the invention. In FIG. 2 adaptive filter 42 implements the "clipped data" least mean square algorithm of equation (1). Data signal $X_m$ is coupled over line 43 to an input of analog delay line 44 and to an input of comparator 45. A second input of comparator 45 is coupled over line 46 to ground potential. Analog delay line 44 has a plurality of stages N where each stage has a tap to provide data $X_{m-1}$, $X_{m-2}$ and $X_{m-N}$ over lines 47-49 respectively. Analog delay line 44 functions to store a discrete analog data sample of the 1st input signal in each stage and to permit non-destructive readout of the discrete analog data sample $X_{m-k}$ at the $k^{th}$ tap ($1 \leq k \leq N$).

Data samples on lines 47-49 are coupled to an input of multipliers 50-52 respectively. The output of multipliers 50-52 are coupled over lines 53-55 to an input of adder 56. Adder 56 functions to sum the discrete analog data samples on lines 53-55 to provide an output on line 57 representative of the signal $Y_m$ which is coupled to an input of adder 58. A second input analog signal having discrete analog data signals $d_m$ representative of a desired signal is coupled over line 59 to a second input of adder 58. Adder 58 functions to subtract the discrete analog data signal $Y_m$ and $d_m$ to provide an output signal over line 60, $\epsilon_m$. Line 60 is coupled to an input of absolute value amplifier 61 and to an input of comparator 62. A second input of comparator 62 is coupled over line 63 to ground potential. Comparator 62 functions to provide an output signal over line 64 indicative of the polarity of the signal on line 60. If $\epsilon_m$ is greater or equal to 0, then the signal on line 64 will be a logic +1, and if $\epsilon_m$ is less than 0, the signal on line 64 will be a logic 0. Line 64 is coupled to an input of exclusive OR gates 65-67 and to a control input of absolute value amplifier 61.

The output of comparator 45 is coupled over line 68 to an input of digital delay line 69. The signal on line 68 sgn$X_m$ provides an indication of the polarity of the data sample $X_m$. The binary signal on line 68 is stored in the digital delay line 69, wherein each stage has a tap to provide a signal to exclusive OR gates 65-67 over lines 70-72. The outputs of exclusive OR gates 65-67 are coupled over lines 73-75 to a control input of steering network circuits 76–78, respectively. Signal $I_G$ is coupled over line 79 to an input of steering network circuits 76–78. Signal $V_1$ which may, for example, equal zero volts is coupled over line 80 to an input of absolute value amplifier 61 and to an input of steering network circuits 76–78. A first and second output of steering network circuit 76 is coupled over lines 81 and 82, respectively, to first and second inputs of bidirectional charge control circuit 83. The output of circuit 83 is coupled over line 84 to an input of integrator 85. Integrator 85 functions to integrate the signal on line 84 and to provide an output on line 86 representative of the weight to be used by multiplier 50. Likewise a first and second output of steering network 77 is coupled over lines 87 and 88, respectively, to a first and second input of bidirectional charge control circuit 89. Likewise, a first and second output of steering network circuit 78 is coupled over lines 90 and 91, respectively, to a first and second input of bidirectional charge control circuit 92. The output of didirectional charge control circuit 89 is coupled over line 93 to an input of integrator 94. The output of integrator 94 is coupled over line 95 to an input of multiplier 51. The output of bidirectional charge control circuit 92 is coupled over line 96 to an input of integrator 97. The output of integrator 97 is coupled over line 98 to an input of multiplier 52.

Steering network 76 functions in response to control signal 73 to couple line 79 to line 81 and line 80 to line 82 if, for example, the signal on line 73 is a logic 0. If the signal on line 73 is a logic 1, then steering network 76 functions to couple line 80 to line 81 and line 79 to line 82. Steering network circuits 77 and 78 operate in a likewise manner as steering network circuit 76.

The output of absolute value amplifier 61 is coupled over line 167 to the 2µ control amplifier 169' and, subsequently, via line 99 to the input of bidirectional charge control circuits 83, 89 and 92. Bidirectional charge control circuits 83, 89 and 92 function to add or subtract an increment of charge from integrators 85, 94 and 97, respectively. The size of the increment added or subtracted is determined by the signal on line 99, and whether the signal is added or subtracted is determined by the signals on lines 81 and 82 to bidirectional charge control circuit 83, for example.

One feature of the embodiment of FIG. 2 is the elimination of N four-quadrant analog multipliers and N−1 comparators as required in some least mean square algorithms. The algorithm of equation (1) requires the calculation of $C_k$, which is described in equation (2), and may be accomplished with N conditional branching operations determined by a binary multiplication, and implemented with a single comparator 45, digital tapped delay line 69 and N exclusive "OR" gates 65–67.

$$C_k = \text{sgn}(\epsilon_m)\text{sgn}(X_{m-k}) = A \oplus B_k \quad (2)$$

The embodiment of FIG. 2 enables parallel update of all N filter weights $W_1 - W_N$ during each data sample $X_m$ in contrast to a sequential update procedure for each weight which requires additional time before the next data sample $X_{m+1}$ may be processed.

Figure 3A:
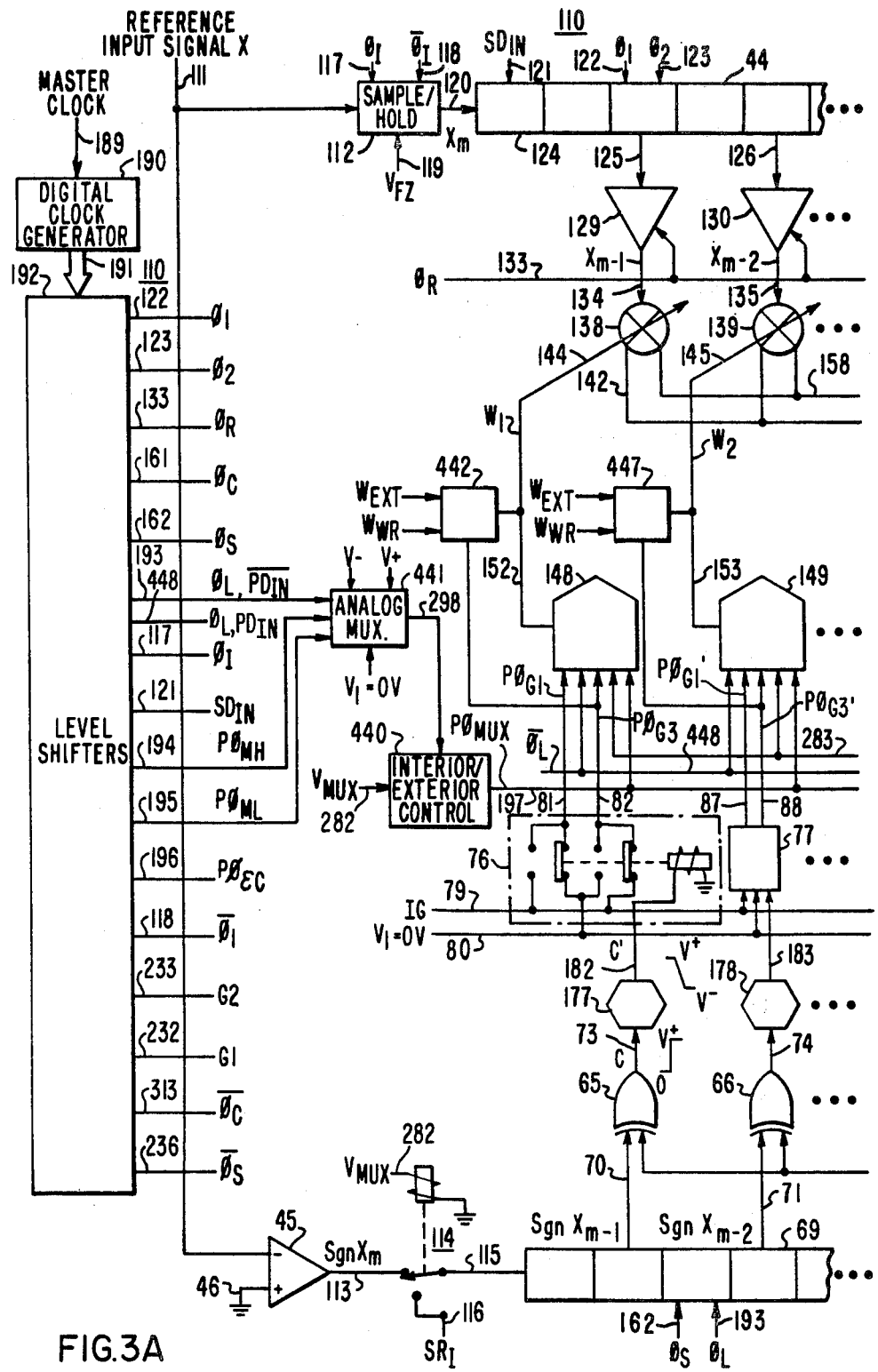
FIGS. 3A and 3B show one embodiment of the invention.
Figure 3B:
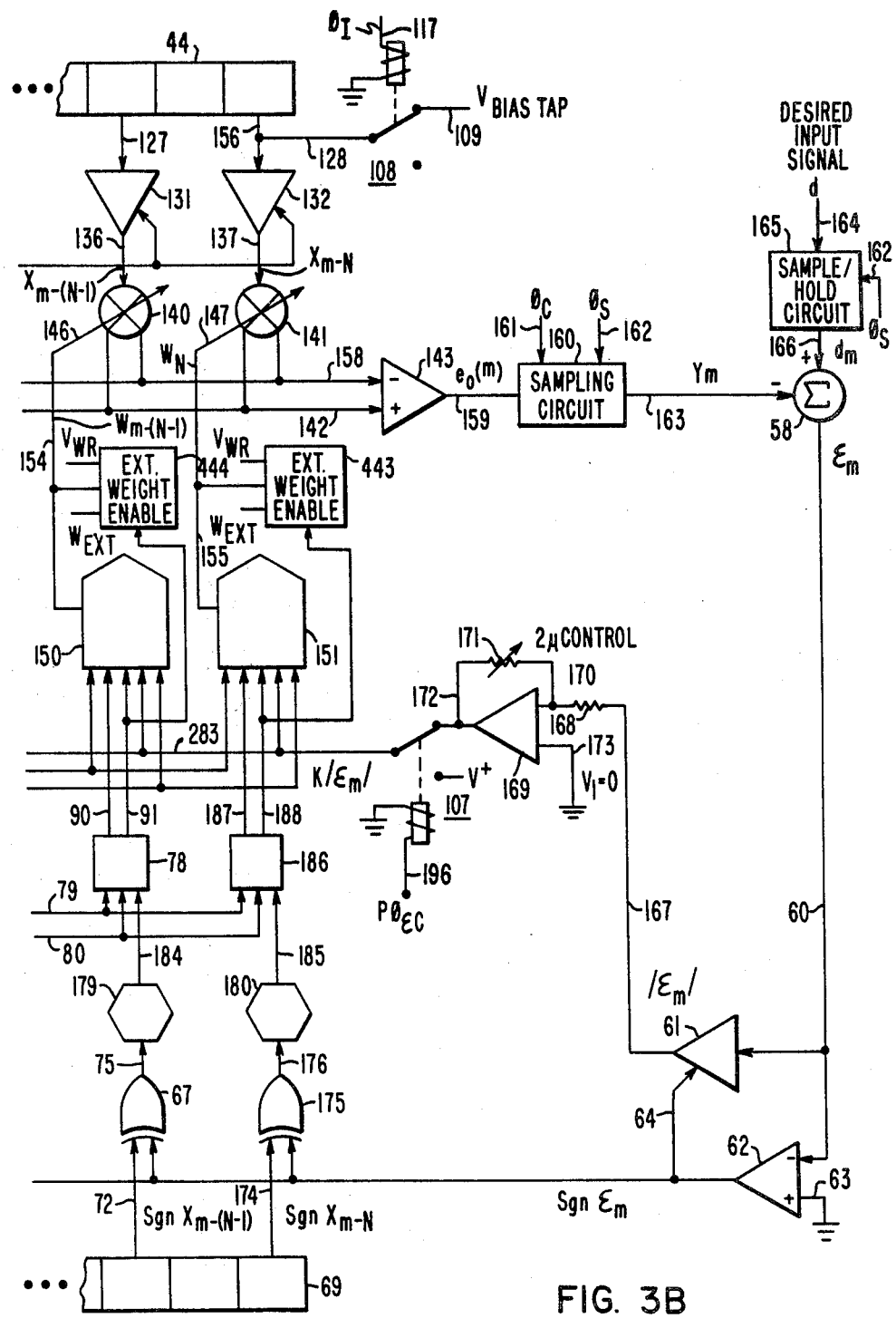

FIGS. 3A and 3B show a more detailed embodiment of the invention. In FIGS. 3A and 3B like references are used for functions corresponding to the apparatus of FIG. 2. Adaptive filter 110 has an analog reference input X coupled over line 111 to an input of sample and hold circuit 112 and to an input of comparator 45. A second input of comparator 45 is coupled over line 46 to ground. The output of comparator 45 is coupled over line 113 to one terminal of switch 114. Switch 114 is a single pole double throw switch having a center terminal coupled over line 115 to an input of delay line 69. Switch 114 is controlled by control signal $V_{mux}$ on line 282. A second terminal of switch 114 is coupled over line 116 to a control signal $SR_I$ which provides a means for coupling an external signal into delay line 69 through switch 114. Relay switches are shown to illustrate the function. It is understood that switches 114, 107, 108 and 76 may be implemented with MOS transistors. Sample/hold circuit 112 has control signals $\emptyset_I$ and $\overline{\emptyset_I}$ coupled over lines 117 and 118 respectively. A voltage potential $V_{FZ}$ is coupled over line 119 to an input of sample/hold circuit 112. Sample/hold circuit 112 functions to insert data sample $X_m$ over line 120 into analog delay line 44. Analog delay line 44 has control signals $SD_{1N}$, $\emptyset_1$ and $\emptyset_2$ coupled over lines 121–123, respectively.

Figure 6:
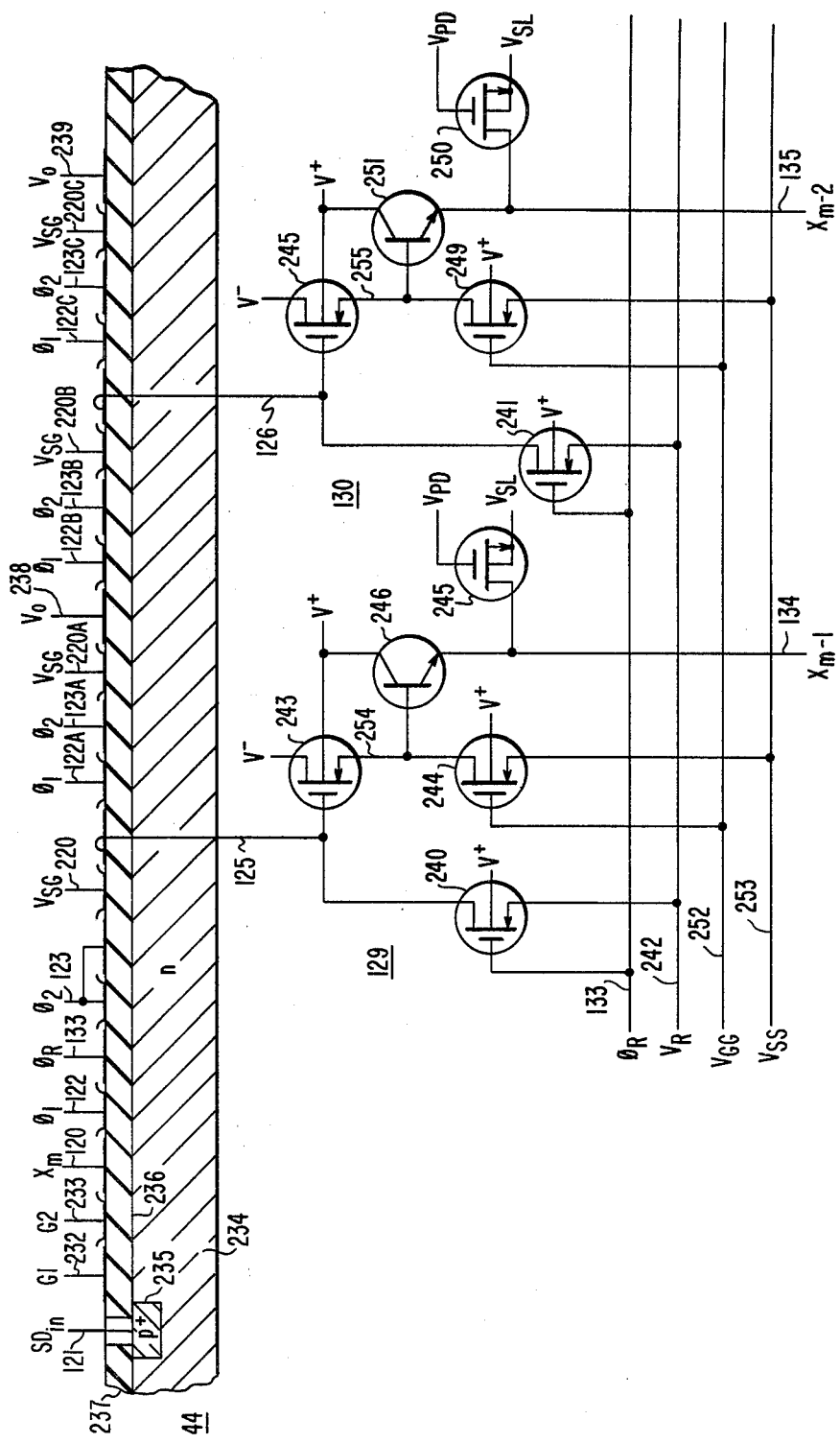
FIG. 6 is a cross-section diagram of a charge coupled delay line and circuitry for non-destructive readout at each tap location.

Delay line 44 may, for example, include a stabilized charge injection circuit 124 which is shown in more detail in FIG. 6. A description of the stabilized charge injection circuit 124 is found in U.S. Pat. No. 4,112,456, issued on Sept. 5, 1978 to D. R. Lampe, M. H. White and A. S. Jensen, entitled "Stabilized Charge Injector for Charge Coupled Devices with Means for Increasing the Speed of Propagation of Charge Carriers" and assigned to the assignee herein. U.S. Pat. No. 4,112,456 is incorporated herein by reference to show a method of injecting charge into a delay line.

Delay line 44 has taps at each stage coupled over lines 125–128 to floating electrode sensor circuits 129–132, respectively. One example of a floating electrode sensor circuit 129 is shown in more detail in FIG. 6. A floating electrode sensor circuit is described also in U.S. Pat. No. 4,041,298, issued on Aug. 9, 1977 to D. R. Lampe and M. H. White, entitled "Floating Clock Sensor for Buffered, Independent, Non-Destructive Readout of Charge Transfer Devices" and assigned to the assignee herein. U.S. Pat. No. 4,041,298 is incorporated herein by reference to show a sensor circuit for non-destructive readout of an analog signal stored in a stage of a tapped delay line.

As shown in FIGS. 3A and 3B control signal $\emptyset_R$ is coupled over line 133 to a control input of floating electrode sensor circuits 129–132. The output of floating electrode sensor circuits 129–132 are coupled over lines 134–137 to multipliers 138–141 respectively. The signals $X_m$ to $X_{m-N}$ on lines 134–137 represent discrete analog data samples stored in respective stages of delay line 44. The second number or weights $W_1$ to $W_N$, which determines the value of each multiplier, will multiply the corresponding discrete data samples $X_m$ to $X_{m-N}$ to obtain the corresponding product from each multiplier 138–141, which is combined together on line 142 and fed into differential weight circuit 143 and shown in more detail in FIG. 7. The weights $W_1$ to $W_N$ representing a number to be multiplied in multipliers 138–141 are stored on integrators 144–147. The value of the weights on integrators 144–147 are increased or decreased in increments by action of bidirectional charge control circuits 148–151 which are coupled over lines 152–155 to integrators 144–147, respectively.

Multipliers 138–141 may, for example, be a MOS analog conductive multiplier which is a MOS transistor operated in its triode region as a programmable analog conductance. One example of an analog multiplier suitable for multipliers 138–141 is described in U.S. Pat. No.

4,034,199 issued on July 5, 1977 to D. R. Lampe, M. H. White, and J. H. Mims, entitled "Programmable Analog Transversal Filter" and assigned to the assignee herein. U.S. Pat. No. 4,034,199 is incorporated herein by reference to show a multiplier for multiplying two analog signals together.

In order to apply negative as well as positive weights or positive and negative numbers to be multiplied in multipliers 138–141 a second transistor is provided which operates in the triode region as shown in FIG. 7 having a voltage $V_{GW}$. The output of the second transistor in each multiplier is coupled over line 158 to a second input of differential weight circuit 143. Differential weight circuit 143 has an output voltage $e_0(m)$ equal to the sum of the products of multipliers 138–141 which may also be expressed mathematically in equation (3).

$$e_0(m) = \sum_{k=1}^{N} W_k X_{m-k} \quad (3)$$

The effective weight of the $k^{th}$ tap at the multiplier is increased by equation (4).

$$W_k = [g_{DSk}(m) - g_{DSO}] \frac{R_F R_2}{R_1} \quad (4)$$

Figure 8:
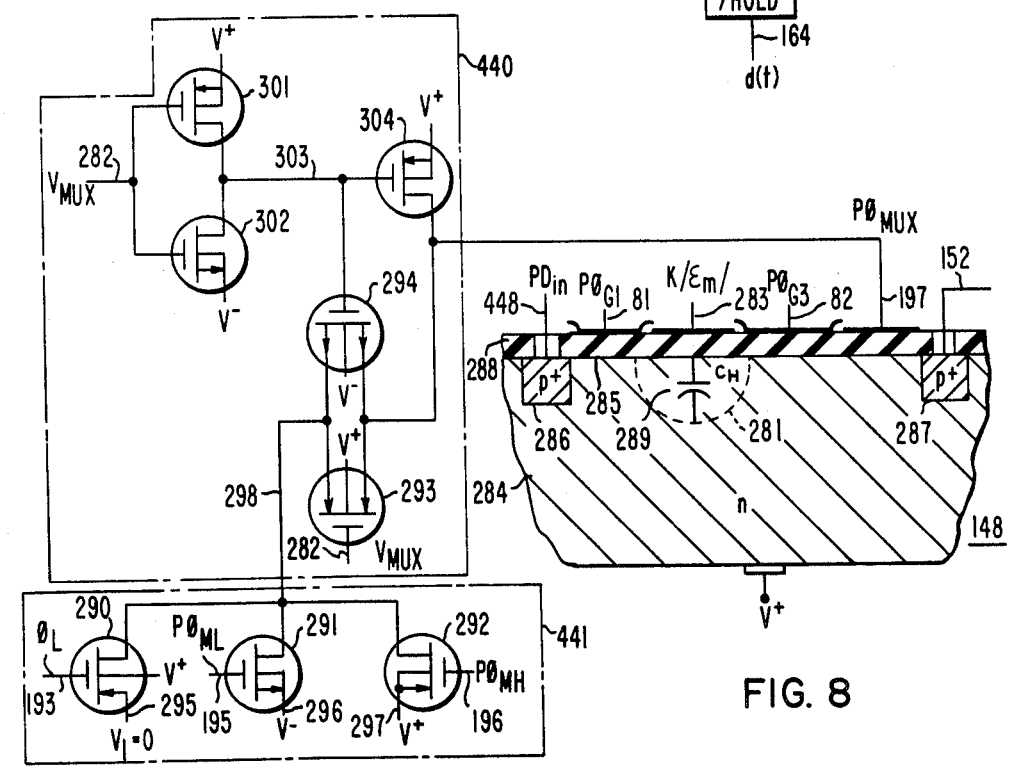
FIG. 8 is a cross-section diagram and circuitry to implement the bidirectional charge control circuit (BC³) for incrementing and decrementing the weight value.

The tap weight $g_{DSk}(m)$ is varied by changing the gate voltage on the MOS transistor. The gate voltage on the MOS transistor for each multiplier is varied in increments or decrements, within an "up-date" data sample time interval, by the input from bidirectional charge control circuits 148–151. A more detailed description of the bidirectional charge control circuit is shown in FIG. 8. The tap weight $g_{DSO}$ is fixed at each tap or multiplier and is controlled by the gate voltage $V_{GW}$ as shown in FIG. 7. The tap weight $W_k$ may be varied from a positive to a negative value by programming $g_{DSk}(m)$ greater than $g_{DSO}$ or $g_{DSk}(m)$ less than $g_{DSO}$, respectively, and the conductance may be written for the MOS transistor in the triode region as expressed in equation (5).

$$g_{DSk}(m) = \mu_n C_o(W/L)[V_{GSk}(m) - V_T] = \beta_o[V_{GSk}(m) - V_T] \quad (5)$$

In equation (5), $\mu_n$ is the electron mobility, $C_o$ is the oxide capacitance per unit area, and (W/L) the width to length ratio of the transistor drain to source channel. $V_{GS}(m)$ is the programmable gate voltage and $V_T$ the fixed threshold voltage of the MOS transistor. Previously mentioned U.S. Pat. No. 4,034,199 describes a technique for a programmable threshold voltage to be realized by a non-volatile storage of information at the multiplier. As shown in FIGS. 7 and 8, $V_{GSk}$ is stored on the gate capacitor $C_G$ of the MOS transistor which may be incremented up or down during each "up-date" time interval by adding or removing charge from the gate capacitor $C_G$.

With respect to FIG. 3B, a direct current bias tap weight supplied on line 109 through switch 108 to line 128 and controlled by $\emptyset_I$ on line 117, is employed to compensate for direct current off-sets in the multipliers, temperature drift in the monolithic chip components, and long term drift in the analog input signals. The fat-zero voltage, $V_{FZ}$, is permitted to reach multiplier 141 when $\emptyset_I$ is low and a direct current bias voltage, $V_{BIAS\ TAP}$, is permitted to reach multiplier 141 when $\emptyset_I$ is high.

The output of differential weight circuit 143 is coupled over line 159 to the input of sampling circuit 160 which is shown in more detail in FIG. 9. Sampling circuit 160 has control signals $\emptyset_C$ and $\emptyset_S$ coupled over lines 161 and 162, respectively. One example of sampling circuit 160 is described in U.S. Pat. No. Re. 30,087, reissued on Aug. 28, 1979, to M. H. White, D. H. McCann, Jr., I. A. G. Mack and F. C. Blaha, entitled "Coherent Sampled Readout Circuit and Signal Processor for a Charge Coupled Device Array" and assigned to the assignee herein.

The output of sampling circuit 160 is coupled over line 163 to an input of adder 58. A desired input signal d is coupled over line 164 to an input of sample/hold circuit 165. Sample/hold circuit 165 functions to represent signal d by a plurality of time spaced discrete analog data signals $d_m$ on line 166 which is coupled to a second input of adder 58. Adder 58 functions to take the difference of its two inputs as expressed in equation (6) to provide an output signal $\epsilon_m$ on line 60 indicative of an error signal.

$$\epsilon_m = d_m - Y_m \quad (6)$$

The output of adder 58 is coupled over line 60 to an input of absolute value amplifier 61 and to an input of comparator 62. A second input of comparator 62 is coupled over line 63 to ground potential. The error signal $\epsilon_m$ is placed into a comparator 62 functioning as a zero-crossing detector due to the grounded second input to provide the sgn $\epsilon_m$ signal indicative of the polarity of the signal on line 60. Comparator 62 may be, for example, an open loop, high-gain, operational amplifier shown in FIG. 10. The output of comparator 62 is coupled over line 64 to a control input of absolute value amplifier 61. One example of an absolute value amplifier 61 is shown in FIG. 11A. The output of absolute amplifier 61 is coupled over line 167 through resistor 168 to an input of the $2\mu$ amplifier 169. This input is coupled over line 170 through variable resistor 171 over line 172 to the output of amplifier 169. A second input of amplifier 169 is coupled over line 173 to voltage potential $V_1$ which may be, for example, at ground potential. The output of amplifier 169 is a constant K times the input on line 167 $|\epsilon_m|$ as expressed in equation (7).

$$K|\epsilon_m| = -\frac{R_{171}}{R_{168}} |\epsilon_m| \quad (7)$$

The value of the constant K is determined by the ratio of resistor 171 to resistor 168 which determines the convergence constant $\mu$ in Equation (1).

Figure 12:
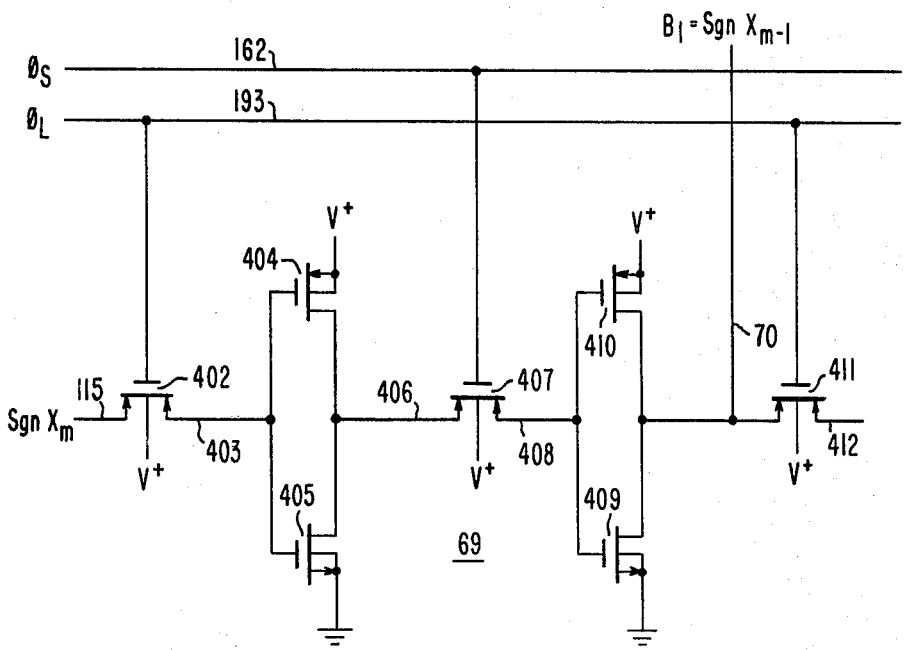
FIG. 12 is a schematic diagram of a portion of the digital tapped delay line.

While the magnitude, scaling, and polarity of the error $\epsilon_m$ is determined, the input signal $X_m$ is placed into a comparator 45 and the output sgn $X_m$ is inserted into a digital tapped delay line 69. One example of digital delay line 69 is shown in FIG. 12. The first tapped output of delay line 69 represents the polarity information of the analog signal $X_{m-1}$ located at the first tap position of the analog delay line 44. Similarly, sgn $X_{m-k}$ represents the polarity of information of $X_{m-k}$ located at the $K^{th}$ tap position of the analog delay line 44. The binary correlation operation expressed by equation (2) is achieved with an exclusive "OR" circuit shown in FIG. 13.

Figure 14:
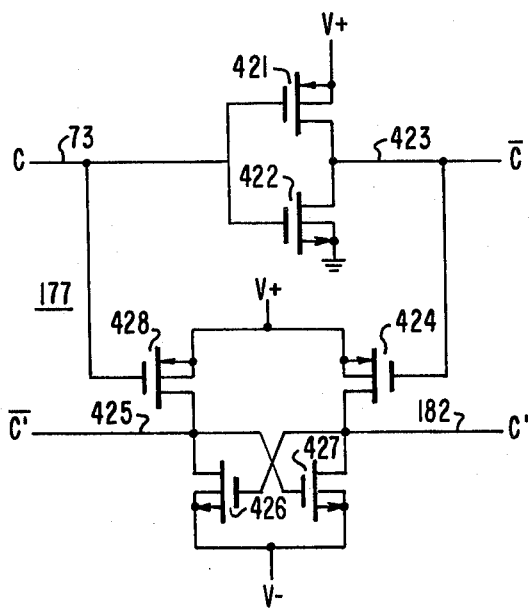
FIG. 14 is a schematic diagram of a level shift circuit.

As shown in FIGS. 3A and 3B, taps 70, 71, 72 and 174 are coupled to an input of exclusive OR gates 65, 66, 67 and 175, respectively. The outputs are coupled over lines 73, 74, 75 and 176 to an input of level shift circuits 177 through 180, respectively. Level shift circuits 177 through 180 function to shift the input voltage from zero volts to V+ to an output of V+ to V−. One example of a level shift circuit 177 is shown in FIG. 14.

The generation of the output $C_k$, as given by equation (2), is important in the control of the bidirectional charge control circuit ($BC^3$). The level shifted value $C'_k$ is applied to the steering network shown in FIGS. 3A, 3B and 15. The steering network is a double pole, double throw switch to apply IG and V1=0 volts to the appropriate gate electrodes P$\phi_{G1}$ or P$\phi_{G3}$, as shown in FIG. 8. The function of the $BC^3$ circuit is to provide an incremental weight update by means of a controlled increase or decrease of charge on the gate electrode of the MOS transistor analog conductance multipliers 138 through 141. Examination of attenuation introduced by the resistor 171 and the capacitance associated with the $BC^3$ indicate the effective $2\mu$ as shown in Equation (8):

$$2\mu = R_{EXT}\beta_O C_H / C_G \qquad (8)$$

In equation (8) $R_{ext}$ is resistor 171 in FIG. 3B; $C_G$ is the capacitance of multiplier circuit 138 or more specifically the capacitance of the gate of the MOS transistor which is operating in the triode region. $C_H$ is the capacitance below electrode 283 in FIG. 8 or the capacitance of potential well 281 below electrode 283.

The output of level shift circuits 177 through 180 couple over lines 182 through 185 to the controlled input of steering network circuits 76 through 78 and 186, respectively. Each steering network 76 through 78 and 186 function as a double pole, double throw switch to place the two input signals on lines 79 and 80 on its two output lines. The control signal to the steering network circuit determines whether the signals on the input are interchanged at the output. The output signals, such as from steering network circuit 186, is coupled over lines 187 and 188 to bidirectional charge control circuit 151. The output of circuit 76 is coupled over lines 81 and 82 to $BC^3$ 148, the output of circuit 77 is coupled over lines 87 and 88 to inputs of $BC^3$ 149 and the outputs of circuit 78 are coupled over lines 90 and 91 to inputs of $BC^3$ 150.

A master clock signal is coupled over line 189 to digital clock generator 190. Digital clock generator 190 functions to generate a plurality of clock signals which are coupled by bus 191 through level shifters 192 to the various circuits. For example, delay line 69 has control signals $\phi_S$ and $\phi_L$ on lines 162 and 193, respectively.

Figure 4:
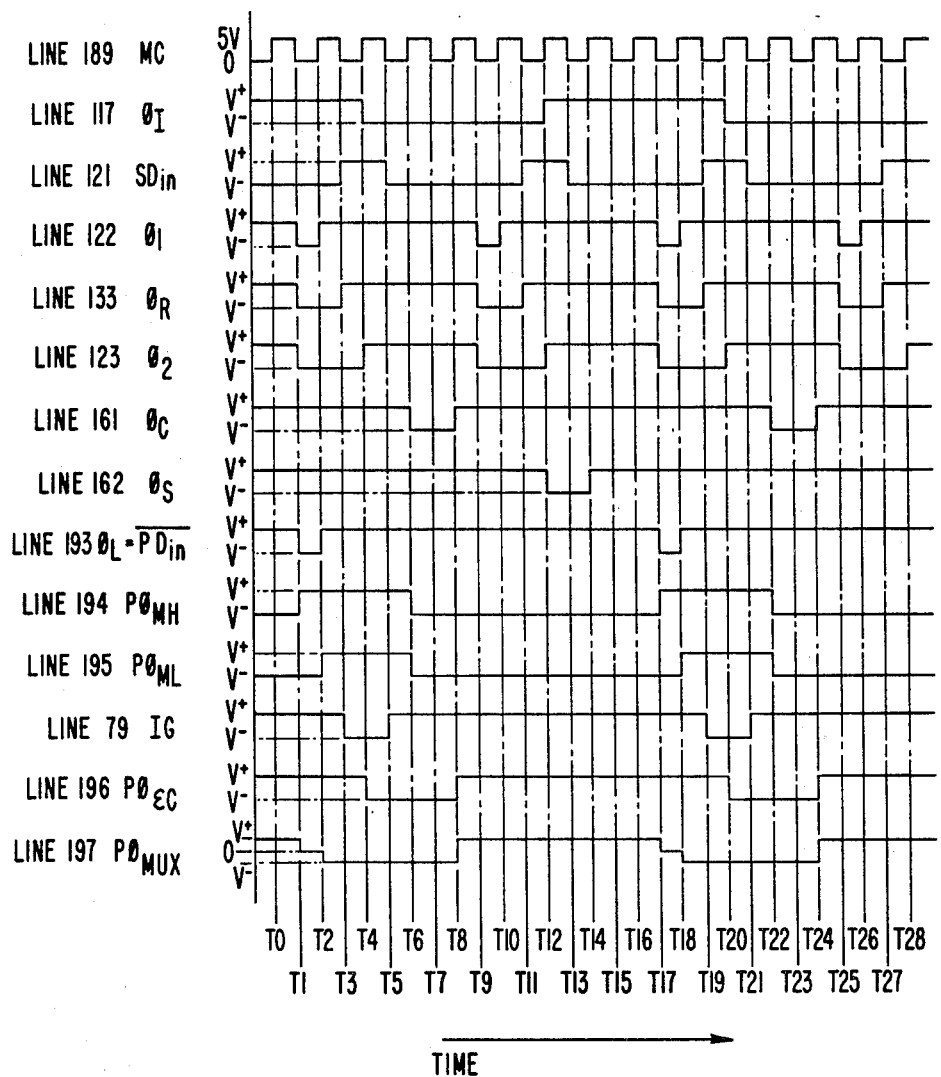
FIG. 4 is a timing diagram for the operation of the embodiment of FIGS. 3A and 3B.

FIG. 4 is a timing diagram for the operation of the embodiment of FIG. 3A and 3B. In FIG. 4 the ordinant represents voltage and the abscissa represents time. At time T4 signal $\phi_I$ on line 117 goes low causing sample/hold circuit 112 to sample the signal X on line 111 and the reference voltage $V_{FZ}$. At time T9 signals $\phi_1$, $\phi_2$, and $\phi_R$ go low causing delay line 44 to begin a data transfer in a delay line towards the first tap, such as line 125. At time T10, signal $\phi_1$ goes high causing charge to be transferred under electrodes 133 and 123 in FIG. 6. At time T11 signal $\phi_R$ on line 133 goes high causing charge to transfer from beneath the electrode 133 to beneath the electrode 123. At time T12 signal $\phi_2$ on line 123 goes high causing the charge to transfer beneath electrode 125 past electrode 220 which has a signal $V_{SG}$ which may be, for example, about zero volts and functions to shield line 125 from transients when $\phi_2$ on electrode 123 goes high. At time T12 the transfer of charge in delay line 44 ends. All data signals $X_{m-k}$ in delay line 44 are valid. At time T14 when signal $\phi_S$ on line 162 goes high, signal $\epsilon_m$ on line 60 is valid. From T14 to T17, time is provided for stabilizing the signals passing through absolute value circuit 61 and amplifier 169. At time T17, the signal on line 172 K$|\epsilon_m|$ is valid. From time T17 through T24 the new weights are updated by means of bidirectional charge control circuits 148 through 151. At time T24 the new weights are ready for the m+1 cycle. At time T24 data from delay line 44 such as $X_{m+1-k}$ is valid. One complete cycle, therefore, with respect to the data is accomplished from time T12 to T28.

Figure 5:
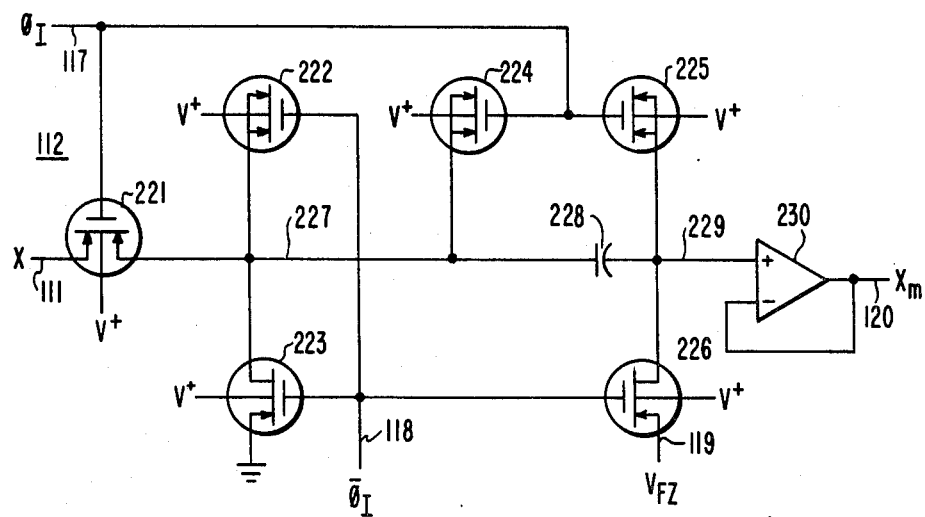
FIG. 5 is a schematic diagram of an input sample/hold circuit.

Referring to FIG. 5 a sample/hold circuit 112 is shown having transistors 221 through 226 which may, for example, be P-channel MOS. Line 111 is coupled through transistor 221 and over line 227 to one side of capacitor 228. The other side of capacitor 228 is coupled over line 229 to an input of amplifier 230. A second input of amplifier 230 is coupled to the output over line 120. Signal $\phi_I$ is coupled over line 117 to the gate of transistor 221, 224 and 225. The signal $\bar{\phi}_I$ is coupled over line 118 to the gate of transistors 222, 223 and 226. The source of transistor 223 is coupled to ground potential. Line 227 is coupled to the source and drain of transistors 221 and 223 and to the source of transistors 222 and 224. Line 229 is coupled to the drain of transistor 226 and source and drain of transistor 225. Some of the transistors in FIG. 5 function to compensate for transient due to signals on lines 117 and 118. Sample and hold circuit 112 functions to sample a reference voltage $V_{FZ}$ on line 119 and at other times to sample the reference voltage $V_{FZ}$ and the signal on line 111 at times when $\phi_I$ is low. At times when $\phi_I$ is high, just the reference voltage is sampled.

FIG. 6 is a cross-sectional diagram of charge coupled delay line 44 and floating electrode sensors 129 and 130. In FIG. 6 delay line 44 has a silicon substrate 234 doped with N type impurities, a P+ region 235 and an upper surface 236. Upon surface 236 is a layer of insulation 237 which functions to support electrodes 232, 233, 120, 122, 133, 123, 220, 125, and 126. Delay line 44 may have, for example, rectangular electrodes transverse to the cross-section shown in FIG. 6. Electrodes 238 and 239 are coupled to $V_O$ potential. The electrodes are positioned on insulation layer 237 to control the charge in the channel beneath upper surface 236 to and from its adjacent areas beneath adjacent electrodes. One feature of delay line 44 is electrodes 220 coupled to voltage $V_{SG}$ which may, for example, be zero volts and function to shield and isolate the capacitive coupling from electrode 123 ($\phi_2$ transient) to electrodes 125 and 126. Another feature of delay line 44 and floating electrode sensors 129 and 130 is that the capacitive coupling to the electrodes 125 and 126 from electrode 122, having control signal $\phi_1$, are shunted through transistors 240 and 241 to line 242. Line 242 is coupled to a voltage such as $V_R$. The gate electrodes of transistors 240 and 241 are coupled over line 133 to control signal $\phi_R$. $\phi_R$ is held high to cause transistors 240 and 241 to be on to remove transients caused by control signal $\phi_1$ on electrodes 122a and 122b. In addition, delay line 44 has a two-phase clock $\phi_1$ and $\phi_2$ which provides for a longer dwell time of the charge in the delay line under floating electrodes 125 and 126. Another feature is that clock signal $\phi_1$ goes high prior to when signal $\phi_2$ goes high tending to push the charge which may be under electrode 122, 122a and 122b to the region underneath electrodes 123, 123a and 123b while control signal $\phi_2$ is low. Floating electrode sensor 129 also has MOS transistors 243 through 245 and a bipolar transistor 246 having its emitter coupled to line 134. Floating electrode sensor 130 has MOS transistors 248 through 250 and bipolar transistor 251 having its emitter coupled to line 135.

In FIG. 6 the gate of transistors 244 and 249 are coupled over line 252 to voltage potential $V_{GG}$. The source of transistors 244 and 249 are coupled over line 253 to voltage $V_{SS}$. Electrode 125 is coupled to the gate of transistor 243 and the drain of transistor 240. The source of transistor 243 is coupled over line 254 to the drain of transistor 244 and the base of transistor 246. The collector of transistor 246 and 251 are coupled to voltage $V+$. Electrode 126 is coupled to the gate of transistor 248 and the drain of transistor 241. The source of transistor 248 is coupled over line 255 to the drain of transistor 249 and the base of transistor 251. The source of transistors 245 and 250 is coupled to voltage $V_{SL}$ which may be, for example, $V-$. The gate of transistors 245 and 250 is coupled to voltage $V_{PD}$ which may be, for example, 2 volts more positive than $V_{SL}$. Transistors 245 and 250 act as a current source to compensate for the current passing through bipolar transistors 246 and 251, respectively.

Referring now to FIG. 7, differential weight circuit 143 has resistors 256 through 261 which may be, fo example, ion implanted in an N substrate to form P type material resistors. Amplifiers 262 through 264 may be, for example, complementary metal oxide semiconductor (CMOS) operational amplifiers of the type shown in FIG. 10. Differential weight circuit 143 has a balanced signal propagation path for the two input signals on lines 142 and 158.

Differential weight circuit 143 has one input coupled on line 158 to one side of resistor 256 and an input of amplifier 262. A second input on line 142 is coupled to one side of resistor 259 and an input of amplifier 263. A second input of amplifiers 262 and 263 are coupled to ground potential. The other side of resistor 256 is coupled to the output of amplifier 262 and to one side of resistor 257. The other side of resistor 257 is coupled to one side of resistor 258 and to an input of amplifier 264. The other side of resistor 259 is coupled to the output of amplifier 263 and to one side of resistor 260. The other side of resistor 260 is coupled to one side of resistor 261 and to an input of amplifier 264. The output of amplifier 264 is coupled over line 159 to the other side of resistor 258. The other side of resistor 261 is coupled to ground.

Line 134 is coupled to the drain of transistors 267 and 268. The source of transistor 267 is coupled to line 158. The source of transistor 268 is coupled to line 142. The body of transistors 67 and 268 as well as 269 and 270 are coupled to voltage $V_{BN}$. Voltage $V_{BN}$ may be, for example, $-0.6$ volts to provide a source to substrate reverse bias. The gate of transistors 268 and 270 is coupled to voltage $V_{GW}$. The gate of transistor 267 is coupled to capacitor 144 over line 152 and to the drain of transistor 271. The source of transistor 271 is coupled to the drain of transistor 272 over line 273. The source of transistor 272 is coupled over line 274 to voltage $W_{EXT}$.

The gate of transistor 269 is coupled to capacitor 147 over line 155 and to the drain of transistor 275. The source of transistor 275 is coupled over line 276 to the drain of transistor 277. The gate of transistor 275 is coupled to voltage $V_{WR}$. The gate of transistors 272 and 277 are coupled to control signal $P\phi_{G3}$. The body of transistors 271, 272, 275, and 277 are coupled to voltage $V+$. The source of transistor 277 is coupled over line 278 to voltage $V_{EXT}$. Transistors 271, 272, 275, and 277 function to permit voltage $W_{EXT}$ to be coupled to capacitor or integrators 144 and 147, respectively, as an alternate means to bidirectional charge control circuits 148 and 149. By controlling switch 114 in FIG. 3A, a proper polarity bit may be placed on delay line 69 which may be shifted to permit updating each capacitor or integrator successively as a single bit is shifted in delay line 69. The combination of delay line 69 with transistors 271, 272, 275, and 277 permit initializing the weights for each tap and permit updating or refreshing the weights on a periodic basis to maintain the appropriate weights during single processing functions. Otherwise, final value of the weight may degrade or change due to leakage currents on the chip, which discharge the capacitance $C_G$.

Referring to FIG. 8, a cross-section diagram is shown of the bidirectional charge control circuit. Substrate 284 may have an upper surface 285 having two spaced apart P+ regions 286 and 287. Above surface 285 is a layer of insulation 288 which in turn supports electrodes connected to lines 81, 283, 82, and 197. Capacitance 289 is formed below surface 285 in substrate 284 with respect to electrode 283. Transistors 290 to 294 provide a conductive path between line 197 and lines 195 through 297. The drain of transistors 290 to 292 are coupled over line 298 to the source of transistors 293 and 294. The drain of transistors 293 and 294 are coupled to line 197. Line 282 is coupled to the gate of transistors 301 and 302. The drain of transistors 301 and 302 are coupled over line 303 to the gate of transistor 304 and the gate of transistor 294. Bidirectional charge control circuit 148 functions to add or subtract charge to integrator 144 which may for example be a capacitor by adding or removing charge over line 152. Other means may be used for adding or subtracting charge from integrator 144 which is well known in the art.

FIG. 9 shows sampling circuit 160, adder 58, and sample/hold circuit 165. The input to sampling circuit 160, line 159, is coupled through capacitor 308 to the drain and source of transistor 309, the drain of transistor 310, and to an input of amplifier 311 over line 312. The gate of transistor 309 is coupled over line 313 to control signal $\phi_C$. The gate of transistor 310 is coupled over line 161 to $\phi_C$. The output of amplifier 311 is coupled over line 314 to a second input of amplifier 311 and to the drain of transistor 315. The source of transistor 315 is coupled over line 316 to one side of capacitor 317 to the input of amplifier 318 and to the drain and source of transistor 319. The source of transistor 310 as well as the other side of capacitor 317 and one side of capacitor 320 are coupled to ground. The output of amplifier 318 is coupled to its inverting input and to one side of resistor 321. The gate of transistor 315 is coupled over line 162 to the gate of transistor 322 and to control signal $\phi_S$. The drain of transistor 322 is coupled over line 164 to control signal d. The source of transistor 322 is coupled over line 323 to an input of amplifier 324, to the other side of capacitor 320 and to the drain and source of transistor 325. The gate of transistors 319 and 325 are coupled over line 326 to control signal $\overline{\phi_S}$. The output of amplifier 324 is coupled over line 166 to its inverting input and to one side of resistor 330. The other side of resistor 330 is coupled to an input amplifier 327 and through resistor 328 to ground potential. The other side of resistor 321 is coupled to a second input of amplifier 327 and through resistor 329 to the output of amplifier 327 on line 60. It is understood that transistors 322 and 315 may function depending upon the voltage to have its drain to act as its source or vice versa. It is understood in the embodiment of FIG. 9 that amplifiers 311, 318, 324, and 327 may be CMOS amplifiers as shown in FIG. 10.

Figure 10:
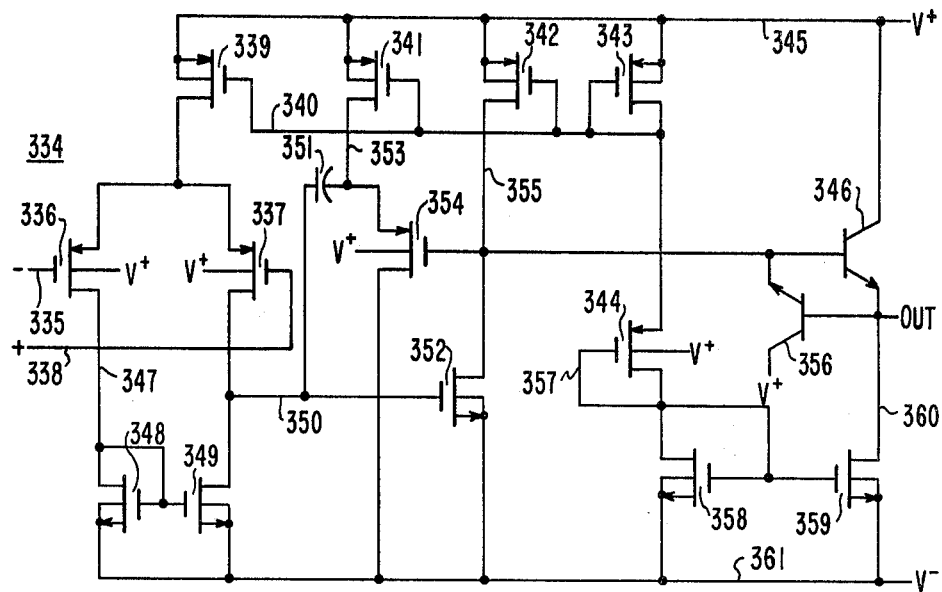
FIG. 10 is a schematic diagram of a CMOS operational amplifier.
Figure 11A:
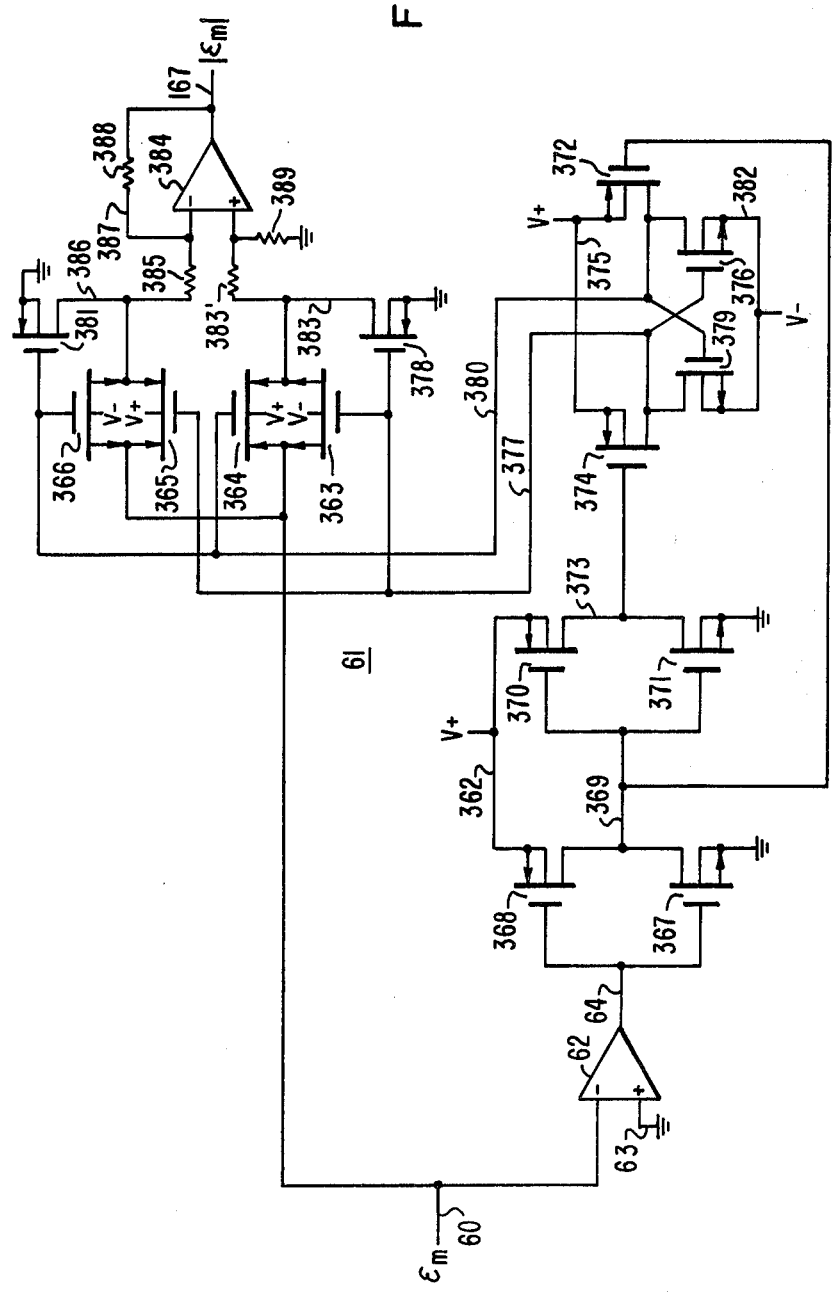
FIG. 11A is a schematic diagram of an absolute value circuit.

FIG. 10 shows a CMOS amplifier 334 having a first input on line 335 which is inverting and coupled to the gate of transistor 336. A second transistor 337 is coupled over line 338 to a second input to amplifier 334 which is non-inverting. The source of transistors 336 and 337 are coupled to the drain of transistor 339. The gate of transistor 339 is coupled over line 340 to the gate of transistors 341 through 343 and the source of transistor 334. The source of transistors 339, 341, 342, and 343 is coupled over line 345 to V+ volts and the collector of transistor 346. The drain of transistor 336 is coupled over line 347 to the drain and gate of transistor 348 and the gate of transistor 349. The drain of transistor 337 is coupled over line 350 to the drain of transistor 349, one side of capacitor 351 and to the gate of transistor 352. The body and source of transistors 348, 349, and 352 are coupled on line 361 to V− potential. The drain of transistor 341 is coupled over line 353 to the other side of capacitor 351 and to the source of transistor 352. The gate of transistor 354 is coupled over line 355 to the drain of transistors 342, 352, the base of transistor 346, and the emitter of transistor 356. The gate of transistor 344 is coupled over line 357 to the drain of transistor 344 and to the gate of transistors 358 and 359. The source and body of transistors 358 and 359 are coupled over line 361 to minus voltage, which may for example be −7.5 volts. The drain of transistor 359 is coupled over line 360 to the emitter of transistor 346 and the base of transistor 356.

In FIG. 10, a bias tree is established to provide steady state bias voltages without actual coupling to ground. The bias voltage may be established by the current path between transistors 343, 344, and 358. The advantage of a zero potential bias voltage without coupling to ground is that circulating ground currents which cause noise is eliminated from the circuit. Transistor 346 provides a bipolar output driver to provide high positive slewing rates of the voltage on line 360. Transistors 343 and 344 are P-channel while transistor 358 is N-channel. Transistor 356 provides a conductive path between lines 360 and 355 to prevent reverse bias of the base emitter junction of transistor 346. Previously, upon fast negative slewing rates, line 355 would fall negative faster than line 360 resulting in turn-off of transistor 346. With this condition, the output on line 360 would stay at the negative voltage such as −7.5 volts until the base of transistor 346 with respect to its emitter becomes forward biased again. Transistor 356 functions to maintain transistor 346 with a minimum negative base-emitter voltage. Transistors 339, 341, 342, 336, 337, and 354 are P-channel MOS transistors. Transistors 348, 349, 352, and 359 are N-channel MOS transistors. Transistors 346 and 356 are NPN bipolar transistors.

In FIG. 11A, signal $\epsilon_m$ is coupled over line 60 to an input of comparator 62 and to the source of transistors 363 through 366. A second input to comparator 62 is coupled over line 63 to ground. The output of comparator 62 is coupled over line 64 to the gate of transistors 367 and 368. The body and source of transistor 367 is coupled to ground. The drain of transistor 367 is coupled over line 369 to the drain of transistor 368 and the gate of transistors 370 through 372. The body and source of transistors 368 and 370 are coupled to voltage supply V+. The body and source of transistors 367 and 371 are coupled to ground potential. The drain of transistor 371 is coupled over line 373 to the drain of transistor 370 and the gate of transistor 374. The body and source of transistors 372 and 374 are coupled over line 375 to voltage V+. The drain of transistor 374 is coupled over line 377 to the gate of transistors 376, 363, 378 and 365 and to the drain of transistor 379. The drain of transistor 372 is coupled over line 380 to the gate of transistors 379, 364, 366, and 381, and the drain of transistor 376. The body and source of transistors 379 and 376 are coupled over line 382 to voltage V−. The body and source of transistors 378 and 381 is coupled to ground. The drain of transistor 378 is coupled to the source of transistors 363 and 364 and through resistor 383 to an input of amplifier 384. Line 167 is coupled to resistor 388 and over line 387 to couple with resistor 385 and input of amplifier 384. Resistor 389 is coupled from the second input of amplifier 384 to ground.

Figure 11B:
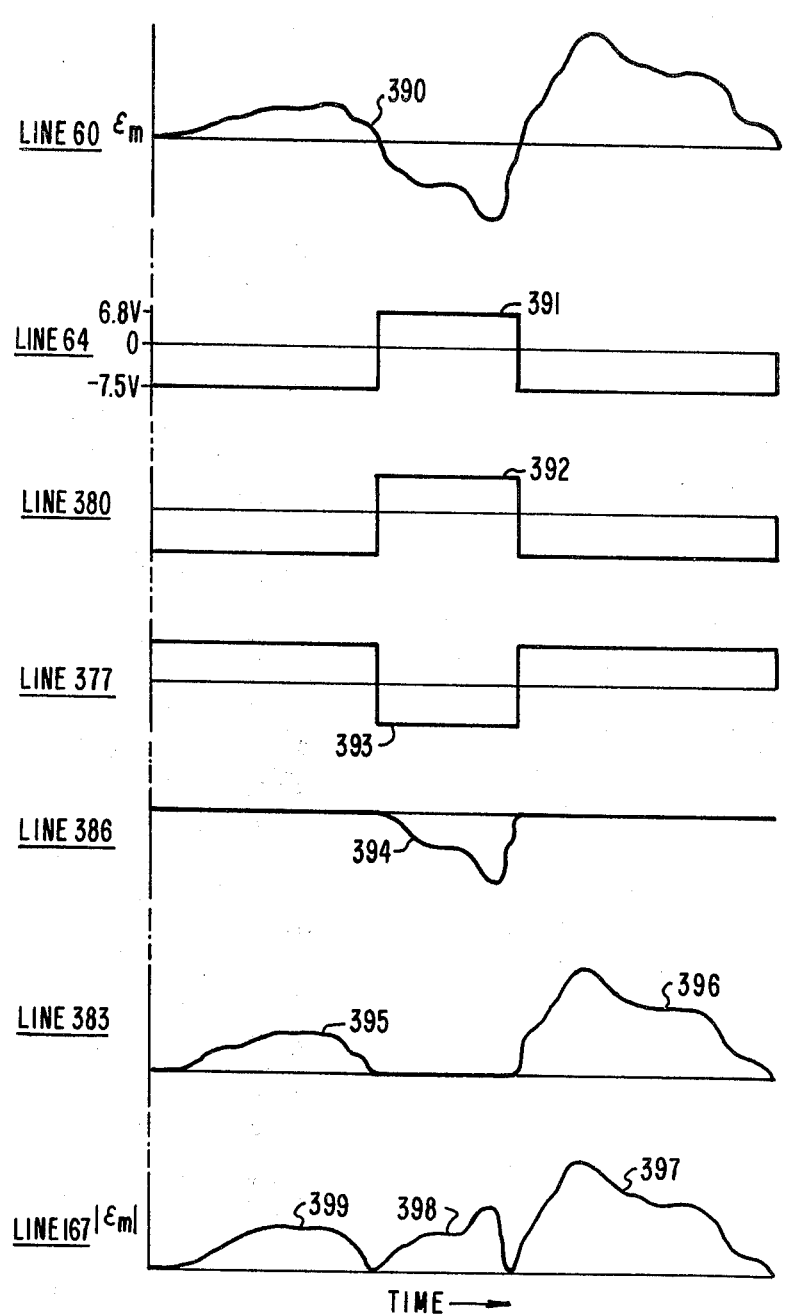
FIG. 11B is a waveform diagram illustrating the operation of the absolute value circuit of FIG. 11A.

In operation the signal on line 60, $\epsilon_m$, is shown by curve 390 in FIG. 11B. When the input on line 60 is positive, line 64 will go to −7.5 volts and when the input on line 60 is negative, line 64 will go 30 6.8 volts as shown by curve 391. When line 64 is negative, transistor 371 conducts causing line 373 to go to ground potential causing transistor 374 to conduct pulling line 377 positive. Transistor 382 begins to conduct pulling line 380 low. When the signal on line 64 is high, the signal on line 380 is high and the signal on line 377 is low. The signals on lines 377 and 380 function to steer the analog signal on line 60 either to the input on line 386 or the input on line 383. The steering effect is shown by curves 394 for the case of the signals on line 386 and by curves 395 and 396 when the signals are on line 383. The output of amplifier of 384 shows the composite waveform, of one polarity, by curve 397. Line 386 is at the inverting input of amplifier 384 and inverts curve 394 to a positive parallel line 167 as shown by curve 398. The amplifier may be a CMOS amplifier as shown in FIG. 10. Comparator 62 also may be CMOS amplifier shown in FIG. 2.

FIG. 12 is a schematic diagram of a portion of the digital tapped delay line.

Referring to FIG. 12, delay line 69 has an input for one stage with line 70 coupling to the source of transistor 402. The drain of transistor 402 is coupled over line 403 to the gate of transistors 404 and 405. The drain of transistors 404 and 405 are coupled over line 406 to the source of transistor 407. The drain of transistor 407 is coupled over line 408 to the gate of transistors 409 and 410. The drain of transistors 409 and 410 are coupled over line 71 to the source of the input transistor 411 of the next stage. Line 193 is coupled to the gate of transistors 402 and 411. Line 162 is coupled to the gate of transistor 407. Delay line 69 functions to store a digital number and to shift a number under control of signals $\emptyset_S$ and $\emptyset_L$ on lines 162 and 193. It is understood that transistors 402, 407 and 411 have drain and sources which may act interchangeably depending upon the logic signal being stored.

Figure 13:
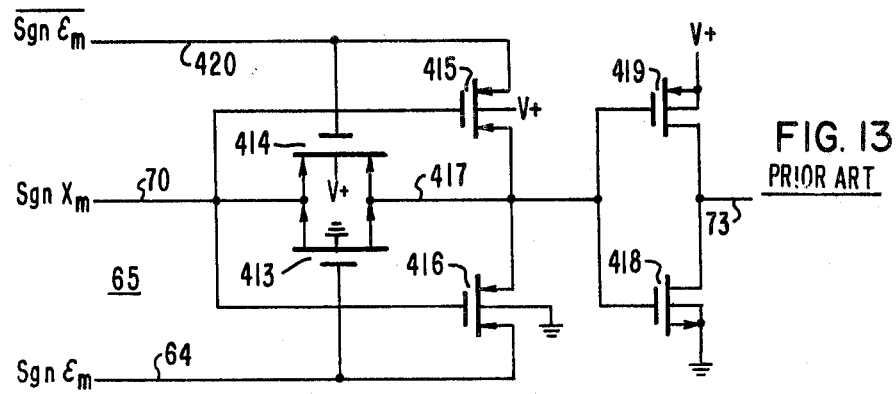
FIG. 13 is a schematic diagram of an exclusive OR circuit.

FIG. 13 is a schematic diagram of an exclusive OR circuit. Line 70 is coupled to the source of transistors 413 and 414 and to the gate of transistors 415 and 416. The drain of transistors 413 and 414 are coupled over line 417 to the source of transistors 415 and 416 and the gate of transistors 418 and 419. Line 64 is coupled to the gate of transistor 413 and the drain of transistor 416. The complement of the signal in line 64 which may, for example, be generated by passing or coupling line 64 to an inverter, is coupled over line 420 to the gate of transistor 414 and the drain of transistor 415. Line 73 is coupled to the drain of transistors 418 and 419. The body and source of transistor 418 is coupled to ground. The body and source of transistor 419 is coupled to V+ volts. It is understood that transistors 413 through 416 may operate in a circuit with the drain and source of each transistor as shown or vice versa depending upon the voltage levels of the signal.

FIG. 14 is a schematic diagram of a level shift circuit. Line 73 is coupled to the gate of transistors 421 through 423. The drain of transistor 421 is coupled over line 423 to the drain of transistor 422 and the gate of transistor 424. The body and source of transistors 421, 428 and 424 are coupled to voltage V+. The drain of transistor 428 is coupled over line 425 to the drain of transistor 426 and the gate of transistor 427. The drain of transistor 424 is coupled over line 182 to the drain of transistor 427 and the gate of transistor 426. The body and source of transistor 422 is coupled to ground potential. The body and source of transistors 426 and 427 is coupled to voltage V−. A signal on line 73, if it is high, will cause the signal on line 423 to be low. Transistor 424 will conduct pulling line 182 high and transistor 426 will conduct pulling line 425 low.

Figure 15:
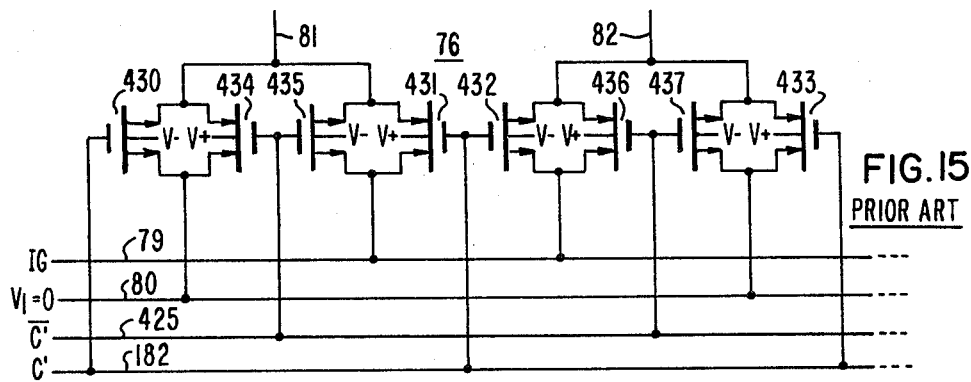
FIG. 15 is a schematic diagram of a steering network circuit.

FIG. 15 is a schematic diagram of a steering network circuit. The steering network circuit 76 functions as a double pole, double throw switch. Line 182 is coupled to the gate of transistors 430 through 433. Line 425 is coupled to the gate of transistors 434 through 437. Line 80 is coupled to the source of transistors 430, 434, 433, and 437. Line 79 is coupled to the source of transistors 435, 431, 432, and 436. Line 81 is coupled to the drain of transistors 430, 434, 435, and 431. Line 82 is coupled to the drain of transistors 432, 436, 437, and 433. It is understood that the source and drain are interchangeable depending upon the voltage levels in the circuit during proper operation.

An adaptive filter has been described for processing an analog reference signal represented by a plurality of time spaced discrete analog data samples each having a single value, comprising means for storing a predetermined number of these successive discrete analog data samples, means for storing the polarity of these successive discrete analog data samples, means for storing a plurality of weights, means for multiplying a plurality of these successive discrete analog data samples by a plurality of the weights to form a plurality of products, means for summing the products together to provide a first output sample, means for processing a second analog desired signal represented by a plurality of time spaced discrete analog data samples each having a single value, means for subtracting the first output sample from the second analog input sample to form a second output sample indicative of an error signal, and means for incrementing the value of each stored weight as a function of the value of the second output sample and the polarity of the successive discrete analog data samples.

The invention further describes an adaptive analog processor incorporating CMOS analog and digital circuitry exhibiting low power, noise and size characteristics suitable for implementation on monolithic integrated circuit chips.

The invention further describes provision for initialization, and internal and external updating of the weights of each tap location.

What we claim is:

1. Apparatus for processing a first analog input signal represented by a plurality of time spaced discrete analog data signals each having a single value comprising:
   first means for storing a predetermined number of said successive discrete analog data signals including a charge coupled device shift register, selected ones of said analog data signals being available at taps;
   second means for detecting and storing the polarity of said successive discrete analog data signals;
   third means including a plurality of capacitors each for storing charge indicative of the weight assigned to a respective tap;
   fourth means for multiplying each of said successive discrete analog data signals available at a tap by the weight assigned thereto to form a plurality of products, said fourth means for multiplying including a plurality of field effect transistors, each having its gate coupled to one side of one of said plurality of capacitors and its drain coupled to said respective tap;
   said fourth means for multiplying further including fifth means for compensating direct current off-sets in said fourth means for multiplying, arising from temperature drift in circuit components causing changes in threshold voltages of field effect transistors, changes in junction leakage currents and from long term drift in said first analog input signal said fifth means for compensating including means for injecting an external voltage at a selected tap of said charge coupled device shift register;
   sixth means for summing said products together to provide a sum signal;
   a second analog input signal represented by a plurality of time spaced discrete analog data signals each having a single value;
   seventh means for subtracting said sum signal from said second analog input signal to form a difference signal;
   and
   eighth means for incrementing the value of each stored weight as a function of the magnitude and polarity of said difference signal and the polarity of said successive discrete analog data signals including ninth means for modifying said charge on each said respective capacitor in response to the polarity of said first analog input signal at said tap and the polarity of said difference signal and including tenth means for determining the magnitude of the change of said charge as a function of the absolute magnitude of said difference signal.

2. Apparatus for processing a first analog input signal represented by a plurality of time spaced discrete analog data signals each having a single value comprising:
   first means for storing a predetermined number of said successive discrete analog data signals including a charge coupled device shift register, selected ones of said analog data signals being available at taps and including a substrate having an upper surface and an insulation layer thereover, a plurality of electrodes positioned adjacent one another on said insulation layer between each of said taps, one of said electrodes coupled to said tap, one of said electrodes adjacent to said electrode coupled to said tap coupled to a bias voltage to shield said electrode coupled to said tap from capacitive coupling from control signals on the other said electrodes;

second means for detecting and storing the polarity of said successive discrete analog data signals;

third means including a plurality of capacitors each for storing charge indicative of the weight assigned to a respective tap;

fourth means for multiplying each of said successive discrete analog data signals available at a tap by the weight assigned thereto to form a plurality of products, said fourth means for multiplying including a plurality of field effect transistors, each having its gate coupled to one side of one of said plurality of capacitors and its drain coupled to said respective tap;

fifth means for summing said products together to provide a sum signal;

a second analog input signal represented by a plurality of time spaced discrete analog data signals each having a single value;

sixth means for subtracting said sum signal from said second analog input signal to form a difference signal; and seventh means for incrementing the value of each stored weight as a function of the magnitude and polarity of said difference signal and the polarity of said successive discrete analog data signals including eighth means for modifying said charge on each said respective capacitor in response to the polarity of said first analog input signal at said tap and the polarity of said difference signal and including ninth means for determining the magnitude of the change of said charge as a function of the absolute magnitude of said difference signal.

3. Apparatus for processing a first analog input signal represented by a plurality of time spaced discrete analog data signals each having a single value comprising:

first means for storing a predetermined number of said successive discrete analog data signals including a charge coupled device shift rgister, selected ones of said analog data signals being available at taps;

second means for detecting and storing the polarity of said successive discrete analog data signals;

third means including a plurality of capacitors each for storing charge indicative of the weight assigned to a respective tap;

fourth means for multiplying each of said successive discrete analog data signals available at a tap by the weight assigned thereto to form a plurality of products, said fourth means for multiplying including a plurality of field effect transistors, each having its gate coupled to one side of one of said plurality of capacitors and its drain coupled to said respective tap;

fifth means for summing said products together to provide a sum signal;

a second analog input signal represented by a plurality of time spaced discrete analog data signals each having a single value;

sixth means for subtracting said sum signal from said second analog input signal to form a difference signal; and seventh means for incrementing the value of each stored weight as a function of the magnitude and polarity of said difference signal and the polarity of said successive discrete analog data signals including eighth means for modifying said charge on each said respective capacitor in response to the polarity of said first analog input signal at said tap and the polarity of said difference signal and including ninth means for determining the magnitude of the change of said charge as a function of the absolute magnitude of said difference signal, said ninth means for determining including a differential amplifier having a negative input terminal, a positive input terminal and an output terminal, a resistor coupled between said negative input terminal and said output terminal, tenth means for coupling said negative input terminal to said difference signal and for coupling said positive input terminal to ground potential at times the polarity of said difference signal is negative.

4. The apparatus of claim 3 further including tenth means for coupling said positive input terminal to said difference signal and for coupling said negative input terminal to ground potential at times the polarity of said difference signal is positive.

5. The apparatus of claim 3 wherein said tenth means for coupling includes first through fourth field effect transistors, each having a drain, source and gate, said first and fourth transistors being of the N channel type and said second and third transistors being of the P channel type, the source of said first through fourth transistors coupled to said difference signal, the drain of said first and second transistor coupled to said negative input terminal, the drain of said third and fourth transistor coupled to said positive input terminal, the gate of said first and third transistor coupled together to a first control signal and the gate of said second and fourth transistor coupled together to a second control signal.

6. Apparatus for processing a first analog input signal represented by a plurality of time spaced discrete analog data signals each having a single value comprising:

first means for storing a predetermined number of said successive discrete analog data signals including a charge coupled device shift register, selected ones of said analog data signals being available at taps;

second means for detecting and storing the polarity of said successive discrete analog data signals;

third means including a plurality of capacitors each for storing charge indicative of the weight assigned to a respective tap;

fourth means for multiplying each of said successive discrete analog data signals available at a tap by the weight assigned thereto to form a plurality of products, said fourth means for multiplying including a plurality of field effect transistors, each having its gate coupled to one side of one of said plurality of capacitors and its drain coupled to said respective tap;

fifth means for summing said products together to provide a sum signal including a differential weight circuit having ion implanted resistors and at least one CMOS operational amplifier fabricated on an integrated circuit chip along with said first and third means for storing and said fourth means for multiplying;

a second analog input signal represented by a plurality of time spaced discrete analog data signals each having a single value;

sixth means for subtracting said sum signal from said second analog input signal to form a difference signal; and seventh means for incrementing the value of each stored weight as a function of the magnitude and polarity of said difference signal and the polarity of said successive discrete analog data signals including eighth means for modifying said charge on each said respective capacitor in response to the polarity of said first analog input signal at said tap and the polarity of said difference signal and including ninth means for determining the magnitude of the change of said charge as a function of the absolute magnitude of said difference signal.

7. Apparatus for processing a first analog input signal represented by a plurality of time spaced discrete analog data signals each having a single value comprising:

first means for storing a predetermined number of said successive discrete analog data signals including a charge coupled device shift register, selected ones of said analog data signals being available at taps;

second means for detecting and storing the polarity of said successive discrete analog data signals;

third means including a plurality of capacitors each for storing charge indicative of the weight assigned to a respective tap;

fourth means for multiplying each of said successive discrete analog data signals available at a tap by the weight assigned thereto to form a plurality of products, said fourth means for multiplying including a plurality of field effect transistors, each having its gate coupled to one side of one of said plurality of capacitors and its drain coupled to said respective tap;

fifth means for summing said products together to provide a sum signal;

a second analog input signal represented by a plurality of time spaced discrete analog data signals each having a single value;

sixth means for subtracting said sum signal from said second analog input signal to form a difference signal; and seventh means for incrementing the vaue of each stored weight as a function of the magnitude and polarity of said difference signal and the polarity of said successive discrete analog data signals including eighth means for modifying said charge on each said respective capacitor in response to the polarity of said first analog input signal at said tap and the polarity of said difference signal and including ninth means for determining the magnitude of the change of said charge as a function of the absolute magnitude of said difference signal, said ninth means for determining including first through sixth field effect transistors each having a gate, drain and source electrode, said first and fourth transistor being of the N channel type and said second, third, fifth and sixth transistors being of the P channel type, said difference signal coupled to the source of said first through fourth transistors, the source of said fifth and sixth transistors coupled to ground potential, the drain of said first, second, and fifth transistors coupled together and to one side of a first resistor, the other side of said first resistor coupled to the negative input terminal of a differential amplifier and through a second resistor to the output terminal of said differential amplifier, the drain of said third, fourth and sixth transistors coupled together and through a third resistor to the positive input terminal of said differential amplifier, a fourth resistor is coupled from said positive input terminal of said differential amplifier to ground potential, the gates of said first, third and fifth transistors coupled to a first control signal which is low at times the polarity of said difference signal is positive, and the gates of said second, fourth and sixth transistors coupled to a complement signal of said first control signal.

* * * * *